(12) United States Patent
Tang

(10) Patent No.: US 7,642,804 B2
(45) Date of Patent: Jan. 5, 2010

(54) TESTING HIGH FREQUENCY SIGNALS ON A TRACE

(75) Inventor: George Tang, Cupertino, CA (US)

(73) Assignee: LSI Corporation, Milpitas, CA (US)

( * ) Notice: Subject to any disclaimer, the term of this patent is extended or adjusted under 35 U.S.C. 154(b) by 0 days.

(21) Appl. No.: 12/334,992

(22) Filed: Dec. 15, 2008

(65) Prior Publication Data

US 2009/0128184 A1      May 21, 2009

Related U.S. Application Data

(62) Division of application No. 11/305,749, filed on Dec. 16, 2005, now Pat. No. 7,489,154.

(51) Int. Cl.
*G01R 31/02* (2006.01)

(52) U.S. Cl. ................................................ 324/765

(58) Field of Classification Search .............. 324/158.1, 324/754–765; 29/825, 829; 333/24 R
See application file for complete search history.

(56) References Cited

U.S. PATENT DOCUMENTS 6,462,570 B1 * 10/2002 Price et al. ................... 324/754
7,208,967 B2 * 4/2007 Ho et al. ...................... 324/763

\* cited by examiner

*Primary Examiner*—Ha Tran T Nguyen
*Assistant Examiner*—Trung Q Nguyen
(74) *Attorney, Agent, or Firm*—William W. Cochran; Cochran Freund & Young LLC

(57) ABSTRACT

A system, apparatus and method for testing and measuring high frequency signals on a trace is described. In one embodiment of the invention, a footprint is manufactured on a trace to allow the testing of a signal while reducing the amount of distortion caused by prior art structures and methods. The footprint is designed to reduce stub effects and capacitance on a signal being communicated on the trace.

7 Claims, 4 Drawing Sheets

TESTING HIGH FREQUENCY SIGNALS ON A TRACE

CROSS REFERENCE TO RELATED PATENT APPLICATIONS

This application is a divisional application of and claims priority to U.S. patent application Ser. No. 11/305,749, entitled "Testing High Frequency Signals on a Trace," filed Dec. 16, 2005.

BACKGROUND

A. Technical Field

This invention relates to signal monitoring, and more particularly, to testing high frequency signals on a trace.

B. Background of the Invention

The importance of integrated circuitry is well known. Technological advancements have led to continual reduction in the size of integrated components and circuitry. The electronic devices employing integrated circuitry have not only seen a reduction in their size but also an improvement in signal processing efficiency. One reason for the improvement of signal processing is the use of higher frequency signals that are able to communicate large amounts of data within an integrated circuit.

As integrated circuits have become smaller and signal frequencies within the circuits have increased, the ability to effectively test and measure signals and components within the circuits has become more difficult. For example, it may be difficult for an engineer to locate a failure in an integrated circuit because of the problems in tapping or extracting an electrical signal internal to the integrated circuit. The ever-increasing signal frequencies on IC traces have made it difficult to effectively tap and monitor these internal IC signals. Electromagnetic interferences, including signal reflection and distortion, oftentimes render a tapped signal unusable for monitoring purposes. Furthermore, footprints on a trace that are designed to allow testing of a signal may reduce the performance of the trace by effectively creating a stub on the trace and/or adding unwanted capacitance.

The existing methods of monitoring signals typically include the use of an oscilloscope to probe a signal on a particular trace. FIG. 1 illustrates an exemplary signal monitoring method using an oscilloscope. As shown therein, a driver 102 sends a signal to a receiver 104 through a signal trace 106, which acts as a medium through which the signal travels. A metallic end of a scope probe 108 is brought in contact with the signal trace 106 resulting in a portion of the signal to be diverted onto the probe and sent to the oscilloscope. The signal traversing between the driver and the receiver can thus be tested.

The probe 108 may distort the signal because its metallic contact may function as a stub resulting in added dispersion and reflection to the signal being monitored. If sufficiently high frequency signals are being monitored, this dispersion and reflection on the signal may render an oscilloscope reading of the signal to be imprecise or unusable.

A sub-miniature A ("SMA") connector may be used to more effectively measure a high speed signal. As illustrated in FIG. 2, "zero ohm" resistors R1 210 and R2 212 may be placed on the trace to allow connection of the SMA connector. It is important to note that a zero ohm resistor may in fact have a small amount of resistance associated with it. During the normal operation of a driver 202 and a receiver 204, the resistor R1 210 is placed in the footprint area specified, while the resistor R2 212 is physically removed. To observe the signal on the PCB trace 206 the resistor R1 210 is then removed and R2 212 placed in the footprint area specified. The signal is directed towards SMA connector 208 to be observed on the scope.

This method reduces the reflections but still adds stub and extra capacitance that are caused by the surface mount footprint on the trace. This stub and capacitance may lead to inaccurate results and distort the signal received by the receiver 204. At specified frequency of operation, which tends to be more than 1 Gbps, the accuracy of the observed results greatly affects the troubleshooting procedure. The extra trace on board in mentioned operating conditions adds to the inaccuracy.

There is a need of a method designed to allow observance of high frequency signals on trace without adding reflections and dispersions into the original signal.

SUMMARY OF THE INVENTION

The present invention provides a system, apparatus and method for measuring and testing high frequency signals on a trace. In one embodiment of the invention, a footprint is manufactured on a trace to allow the testing of a signal while reducing the amount of distortion caused by prior art structures and methods. In one embodiment, the footprint allows surface mount resistors to be connected to define a particular path for the signal. A first path is provided in which the signal is communicated on the trace between IC components, such as a driver and a receiver. A second path is provided in which the signal is communicated from the trace to a testing or measurement device, such as an oscilloscope.

In one embodiment of the invention, the footprint is manufactured by partially overlaying a first surface mount area with a second surface mount area. The first and second surface mount areas may be positioned at a 90 or 180 degree angle from each other. This footprint design minimizes stub effects and capacitance generated by prior art testing connections.

A user is able to define the path a signal travels by removing or inserting surface mount components on the footprint. In particular, the footprint may operate in two modes depending on where surface mount components are located on the footprint. These surface mount components are components that conduct electrical current such as zero ohm resistors and alternating current coupling capacitors.

In one embodiment, the footprint is provided to test single ended signaling. In another embodiment, the footprint is provided to test differential signaling. Various testing devices may be used in connection with the footprint including an oscilloscope with SMA connector(s).

Other objects, features and advantages of the invention will be apparent from the drawings, and from the detailed description that follows below.

BRIEF DESCRIPTION OF THE DRAWINGS

Reference will be made to embodiments of the invention, examples of which may be illustrated in the accompanying figures. These figures are intended to be illustrative, not limiting. Although the invention is generally described in the context of these embodiments, it should be understood that it is not intended to limit the scope of the invention to these particular embodiments.

DETAILED DESCRIPTION OF THE PREFERRED EMBODIMENTS

A system, apparatus and method for observing a high frequency signal on a trace is described. The system may operate in multiple modes including a first mode in which a signal is communicated between a driver and a host, and a second mode in which the signal is communicated to a measurement device, such as an oscilloscope. A footprint that is located on a trace allows for the switching between modes while minimizing the amount of distortion on the signal during either of the modes of operation.

The invention described herein is explained using specific exemplary details for better understanding. However, the invention disclosed can be worked on by a person skilled in the art without the use of these specific details. The implementations of the invention can be embodied into a multiple types of printed circuit boards. The block diagrams shown are only exemplary implementation as per the rules dictated by the invention. Also, the connections between various components may not necessarily be direct. The components may not necessarily be on same board or plane but may be connected using a backplane. Further, the signal routing in between can be subjected to encoding, re-formatting or modifications.

References in the specification to "one embodiment" or "an embodiment" means that a particular feature, structure, characteristic, or function described in connection with the embodiment is included in at lest one embodiment of the invention. The appearances of the phrase "in one embodiment" in various places in the specification are not necessarily all referring to the same embodiment.

A. System Overview

Figure 1:
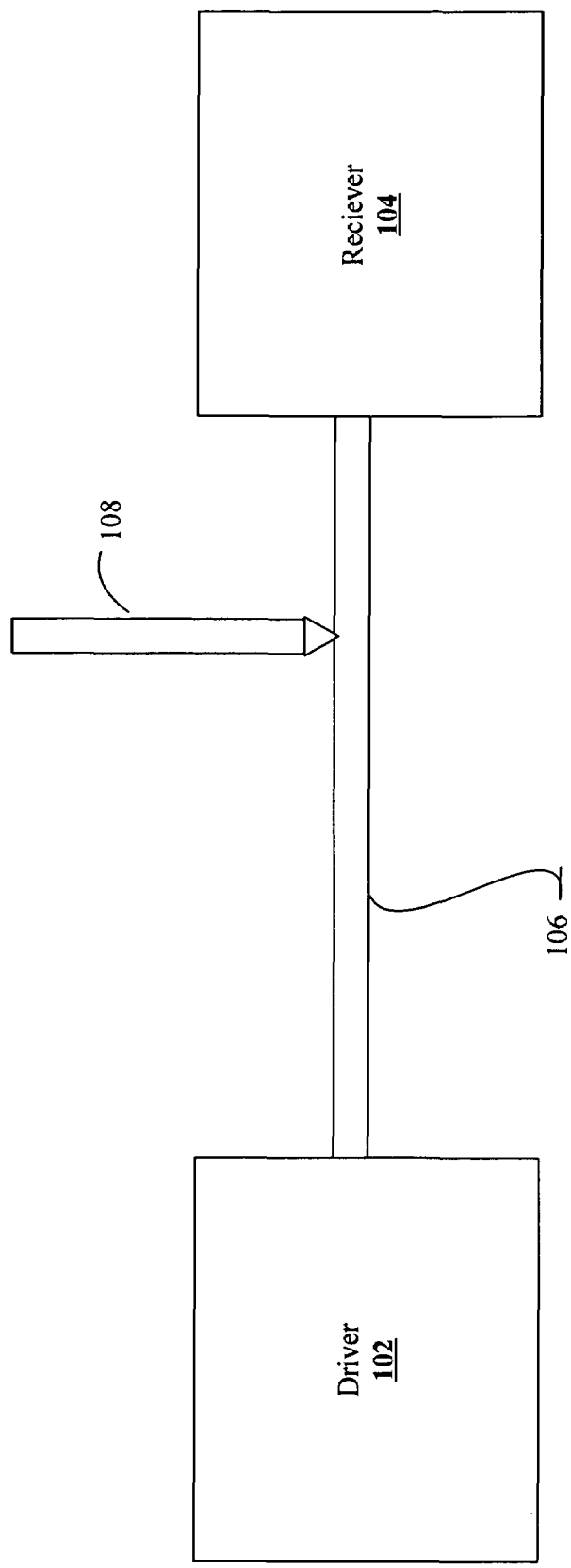
FIG. 1 shows a block diagram of a system for directing signal for monitoring using scope probe.
Figure 2:
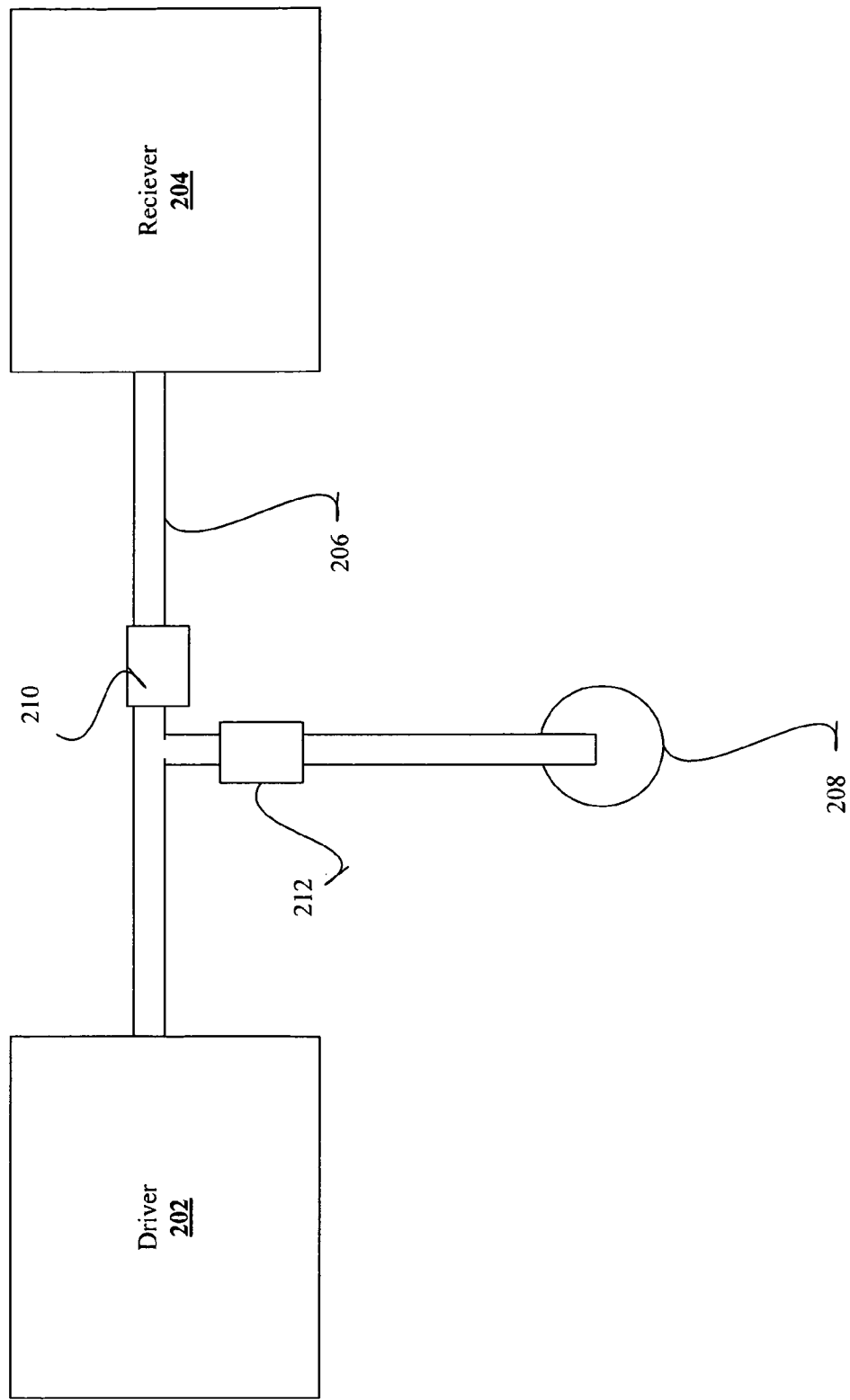
FIG. 2 is a block diagram of a system-allowing signal monitoring present in prior art.
Figure 3:
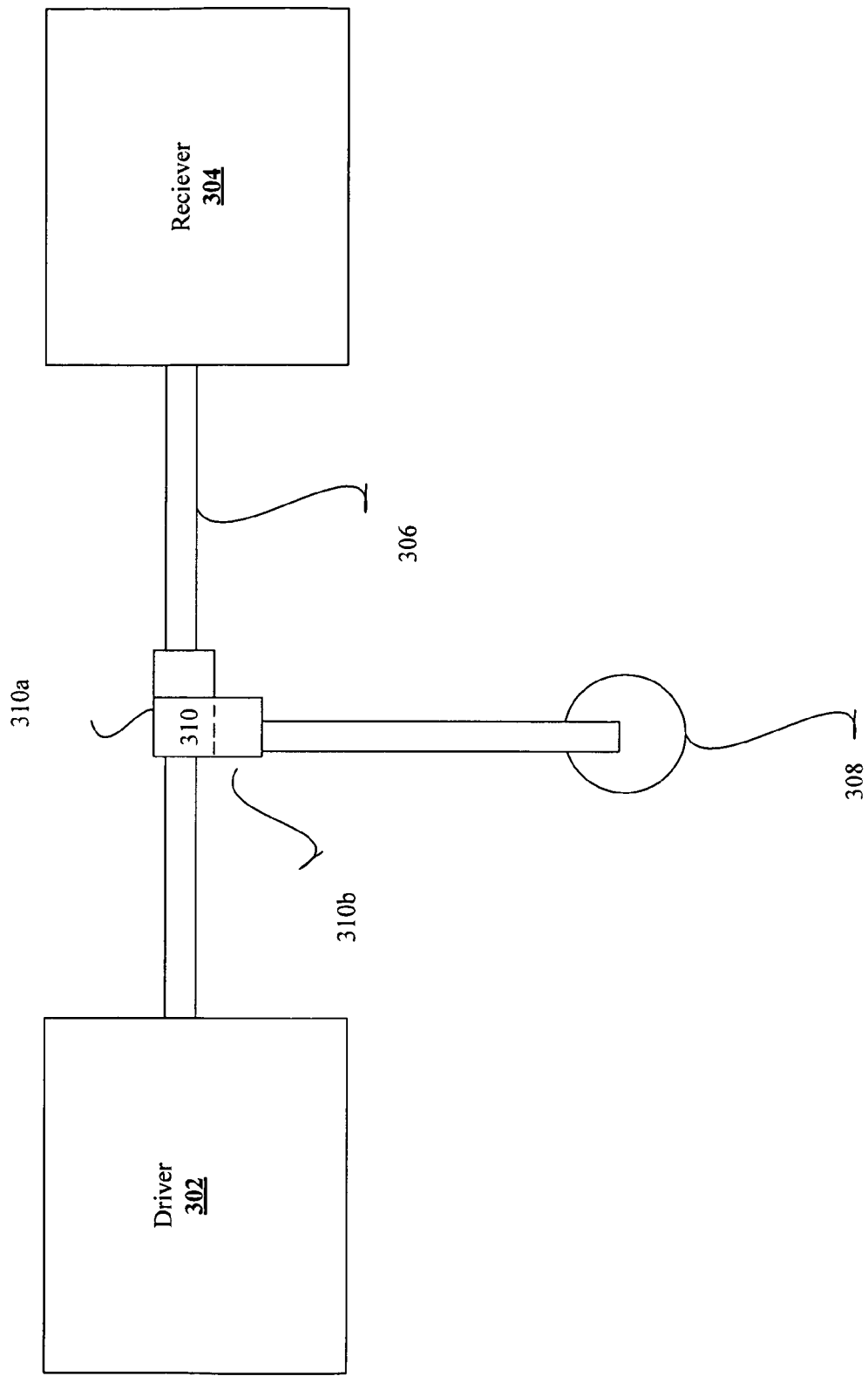
FIG. 3 is a block diagram of the system as designed by the present invention to allow monitoring of signal using single ended signaling according to one embodiment of the invention.

FIG. 3 illustrates a signal measurement footprint located on a trace according to one embodiment of the invention. The signal being observed is the signal traversing between the driver 302 and the receiver 304 on a common board. The components can alternatively be on different boards connected using a backplane or other connecting means. The signal travels from driver to the receiver via trace 306, such as a PCB trace.

According to one embodiment of the invention, the system has two modes of operation. During a first mode of operation, the signal is communicated from a driver 302 to a receiver 304 via the trace 306. Comparatively, during a second mode of operation, the signal is communicated from the driver 302 to a connector 308, such as an SMA connector, so that it may be measured by a measuring device. The connector 308 may be defined to have specific impedance value, aligning it with the input of the scope. For example, an SMA connector may be used having an impedance value be 50 ohms that matches an impedance value of an oscilloscope.

A footprint is provided on the trace to allow a user to switch between the two modes. The footprint comprises a first area 310a on which a surface mount component may be positioned to enable current to flow between the driver 302 and the receiver 304. The footprint comprises a second area 310b that is partially overlaid on the first area 310a and on which a surface mount component may be positioned to enable current to flow from the driver 302 to the connector 308. It is important to note that the driver 302 and receiver 304 are exemplary components and the present invention is applicable to any two components between which a signal travels.

A user is able to effectively switch the mode of the footprint by removing or inserting a surface mount component on the first or second areas of the footprint. The surface mount components may be numerous different components that conduct an electrical signal including a zero ohm resistor and alternating current coupling capacitor.

B. Footprint Design

The invention minimizes the distortion of a signal using a specific footprint located on a trace. Referring again to FIG. 3, a first surface area 310a and a second overlaid surface area 310b create a footprint that allows a user to switch between modes in order to drive a receiver 304 or test the signal going to the receiver 304. In one of the embodiment of the invention, the first and second surface areas 310a, 310b are positioned at 90 degrees or 180 degrees relative to each other. The angle between the two footprints may be changed depending on the design of the trace. However, the preferred angular displacement between the first and second surface areas 310a, 310b is 90° and 180°. Such an arrangement provides overlapped resistor/footprint area, which minimizes any stubs and capacitance that might have been caused by the footprint.

Figure 4:
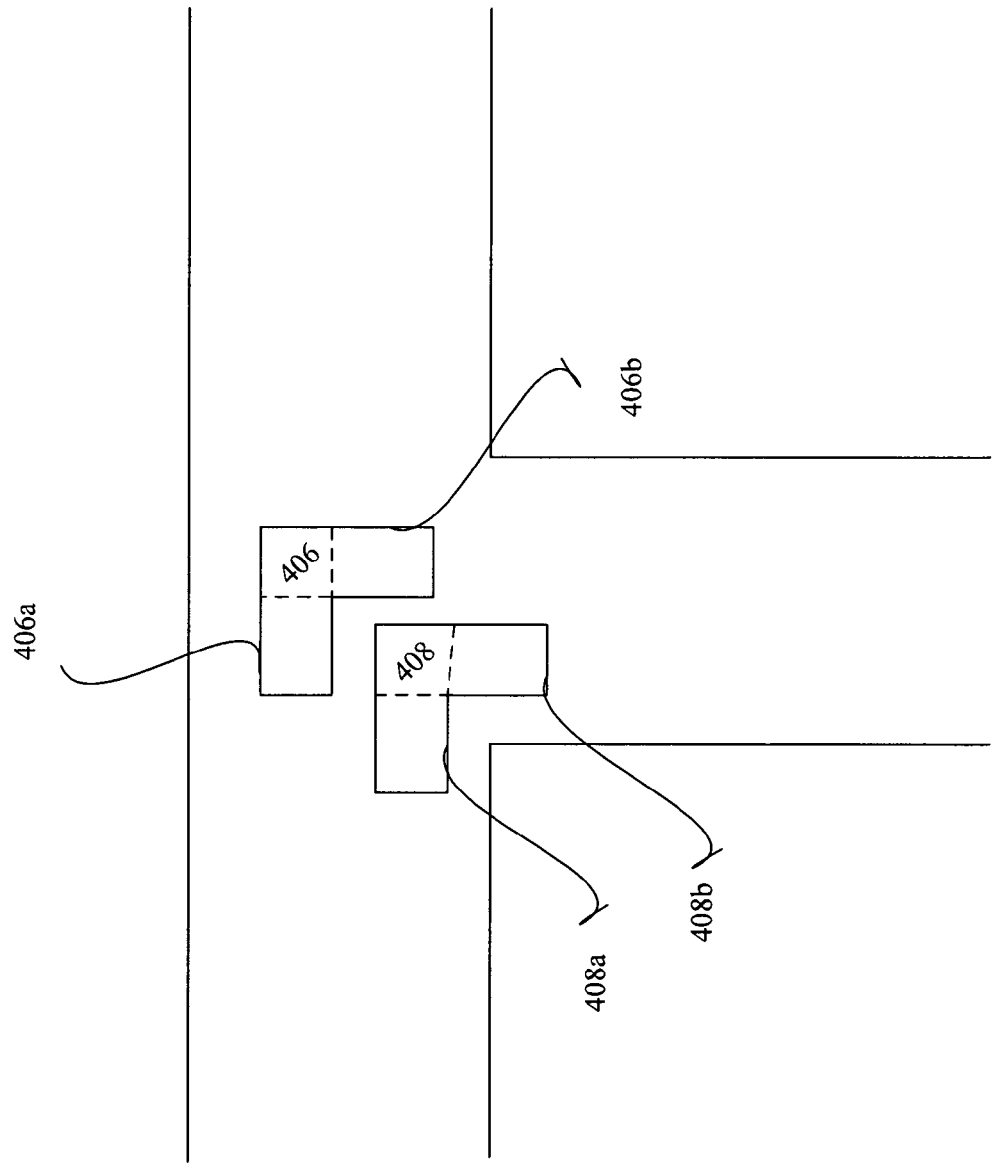
FIG. 4 is a diagram representing the footprints design as suggested by the present invention using differential signaling according to one embodiment of the invention.

In another of the embodiment of the invention, differential signaling measurement is provided by multiple footprints on a trace. FIG. 4 illustrates exemplary footprints that provide differential measurement a signal on a trace. The footprints 406, 408 allow for differential signals to be measured using a connector(s) that interfaces with the footprints. The footprints 406, 408 comprise overlaid surface areas 406a, 406b and 408a, 408b respectively, minimizing any capacitance or stubs caused by the footprints.

C. Modes of Operation

As described above, one embodiment of the invention provides for a trace signal measurement system having two modes of operation. A first mode operates in which a signal is communicated on a trace without any measurement and a second mode operates in which the signal is communicated to a measuring device, such as an oscilloscope. A footprint is provided on the trace that allows a user to switch between modes.

a) First Mode of Operation

Referring to FIG. 3, a surface mount component is connected on a first surface area 310a of the footprint 310 and a second surface area 310b on the footprint 310 is open during operation in the first mode. This surface mount component may be a variety of different components that transmit electrical current including a zero ohm resistor or capacitor. Accordingly, current is allowed to flow between the driver 302 and the receiver 304 while prevented from flowing through the second surface area 310b. The footprint 310 minimizes or removes a stub and capacitance effects resulting from the gap at the second surface area 310b.

FIG. 4 illustrates a footprint or footprints that enable differential testing of a signal according to one embodiment of the invention. In this particular example, a first footprint 406 and a second footprint 408 are located on a trace. The first footprint 406 has a first surface area 406a and a second surface area 406b similar to the footprint described above. The second footprint 408 has also a first surface area 408a and a second surface area 408b.

A user may switch to a first mode, in which the signal travels between two components coupled by the trace, by inserting surface mount components at surface areas 406a and 406b. Accordingly current is allowed to flow through the surface areas 406a and 408a with minimal distortion caused by the design of the footprints 406 and 408. Current is not able to flow through the surface areas 406b and 408b because of the gap left by the removal of surface mount components. The differential mode signaling may improves electromagnetic compatibility and may be more suited to the high frequency applications.

b) Second Mode of Operation

A second mode of operation is provided that allows a signal on a trace to be measured and otherwise tested. Referring to FIG. 3, a surface mount component is connected at surface area 310b on footprint 310 while a gap at 310a is created by removing a surface mount component. Once again, these surface mount components may be a variety of different components that transmit electrical current including a zero ohm resistors or capacitors. Attaching a component on footprint area 310b allows the signal from the driver 302 to be directed to a connector 308, such as an SMA connector, on which the signal is provided to a measuring device.

Referring to FIG. 4, a second mode of operation is shown relative to a differential signaling model. The second mode of operation is initiated by removing the surface mount components at 406a and 408b and inserting surface mount components at 408a and 408b. In one embodiment, surface mount capacitors are used because they will transmit high frequency signals and filter lower frequency signals. A connector or connectors are coupled to transmit the signal to a measurement device, such as an oscilloscope.

During the second mode of operation, the signal being tapped may be transmitted on a uniform trace, having a minimum excess trace structure that may function as a stub or provide unwanted capacitance.

The present invention thus provides a method for high accuracy and minimum distortion monitoring of a signal as is needed in high frequency measurements. The method can be used during testing, troubleshooting and validation procedures to ensure proper working of the electronic devices.

While the present invention has been described with reference to certain exemplary embodiments, those skilled in the art will recognize that various modifications may be provided. Accordingly, the scope of the invention is to be limited only by the following claims.

I claim:

1. A method for testing a signal in an integrated circuit, the method comprising:
   removing a first surface mount component from a first area of a footprint in the integrated circuit to prevent the signal from being transmitted on the trace;
   inserting a second surface mount component on a second area of the footprint to communicate the signal to a measuring device;
   wherein the second area of the footprint is located at a ninety degree angle relative to the first area of the footprint; and
   measuring the signal using the measuring device that received the signal.

2. The method of claim 1 wherein a second footprint is provided to enable testing a differential signal.

3. The method of claim 1 wherein the second surface mount component is a zero ohm resistor.

4. The method of claim 1 wherein the second surface mount component is an alternating current coupling capacitor.

5. The method of claim 1 further comprising the step of coupling a connector to the second surface mount component and the measuring device.

6. The method of claim 5 wherein the connector is a subminiature A connector.

7. The method of claim 5 wherein the measuring device is an oscilloscope.

* * * * *